United States Patent
Yen et al.

(10) Patent No.: US 10,353,775 B1
(45) Date of Patent: Jul. 16, 2019

(54) ACCELERATED DATA COPYBACK

(71) Applicant: SK hynix Inc., Gyeonggi-do (KR)

(72) Inventors: Johnson Yen, Fremont, CA (US); Hong Lu, San Jose, CA (US); Gong Luo, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/817,117

(22) Filed: Aug. 3, 2015

Related U.S. Application Data

(60) Provisional application No. 62/034,053, filed on Aug. 6, 2014.

(51) Int. Cl.
*G06F 11/10* (2006.01)
*H03M 13/11* (2006.01)

(52) U.S. Cl.
CPC ...... *G06F 11/1096* (2013.01); *G06F 11/1004* (2013.01); *H03M 13/1102* (2013.01)

(58) Field of Classification Search
None
See application file for complete search history.

(56) References Cited

U.S. PATENT DOCUMENTS

| | | | | |
|---|---|---|---|---|
| 6,725,392 | B1* | 4/2004 | Frey | G06F 11/1076 714/15 |
| 2004/0210794 | A1* | 10/2004 | Frey | G06F 11/1076 714/5.1 |
| 2007/0294565 | A1* | 12/2007 | Johnston | G06F 11/1076 714/6.12 |
| 2009/0241006 | A1* | 9/2009 | Liikanen | G06F 11/1072 714/752 |
| 2010/0174969 | A1* | 7/2010 | Ashe | G11B 20/1833 714/781 |
| 2010/0223539 | A1* | 9/2010 | Nowoczynski | G06F 3/061 714/807 |
| 2013/0054871 | A1* | 2/2013 | Lassa | G06F 3/061 711/103 |
| 2014/0032836 | A1* | 1/2014 | Pan | G06F 11/108 711/114 |
| 2014/0040698 | A1* | 2/2014 | Loh | G06F 13/1668 714/758 |

* cited by examiner

*Primary Examiner* — M. Mujtaba Chaudry
(74) *Attorney, Agent, or Firm* — IP & T Group LLP

(57) ABSTRACT

A single instruction is received to read a read address in storage in order to obtain read data and write the read data to a write address in the storage. Error correction decoding is performed in order to obtain user data. Error correction parity information is generated based at least in part on (1) the user data and (2) new metadata associated with the write address, without buffering the user data between the error correction decoding and the generation of the error correction parity information. The user data, the new metadata, and the error correction parity information are stored in the write address in the storage.

11 Claims, 2 Drawing Sheets

Format of Stored Data (All Fields Scrambled)

Format of Stored Data (All Fields Scrambled)

ACCELERATED DATA COPYBACK

CROSS REFERENCE TO OTHER APPLICATIONS

This application claims priority to U.S. Provisional Patent Application No. 62/034,053 entitled ACCELERATED DATA COPYBACK filed Aug. 6, 2014 which is incorporated herein by reference for all purposes.

BACKGROUND OF THE INVENTION

Copyback is a process whereby data is read back from storage (such as a solid state storage, including NAND Flash) and written back to storage (e.g., at a different address or location). In the case of solid state storage systems, information is stored in the form of voltage or charge by cells. Over time, the amount of charge stored may drift outside of some preferred range, for example because additional charge is unintentionally added, or because charge leaks out as the electrical insulation of the solid state storage media breaks down. Thus, copybacks may periodically be performed to refresh the amount of charge stored. Other storage management processes may also use copybacks.

Because of some characteristics or properties that are specific to solid state storage, copybacks may occur more frequently compared to other types of storage systems, such as hard disk drive systems. It would be desirable if improved copyback techniques were developed, specifically that accelerated the copyback process.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
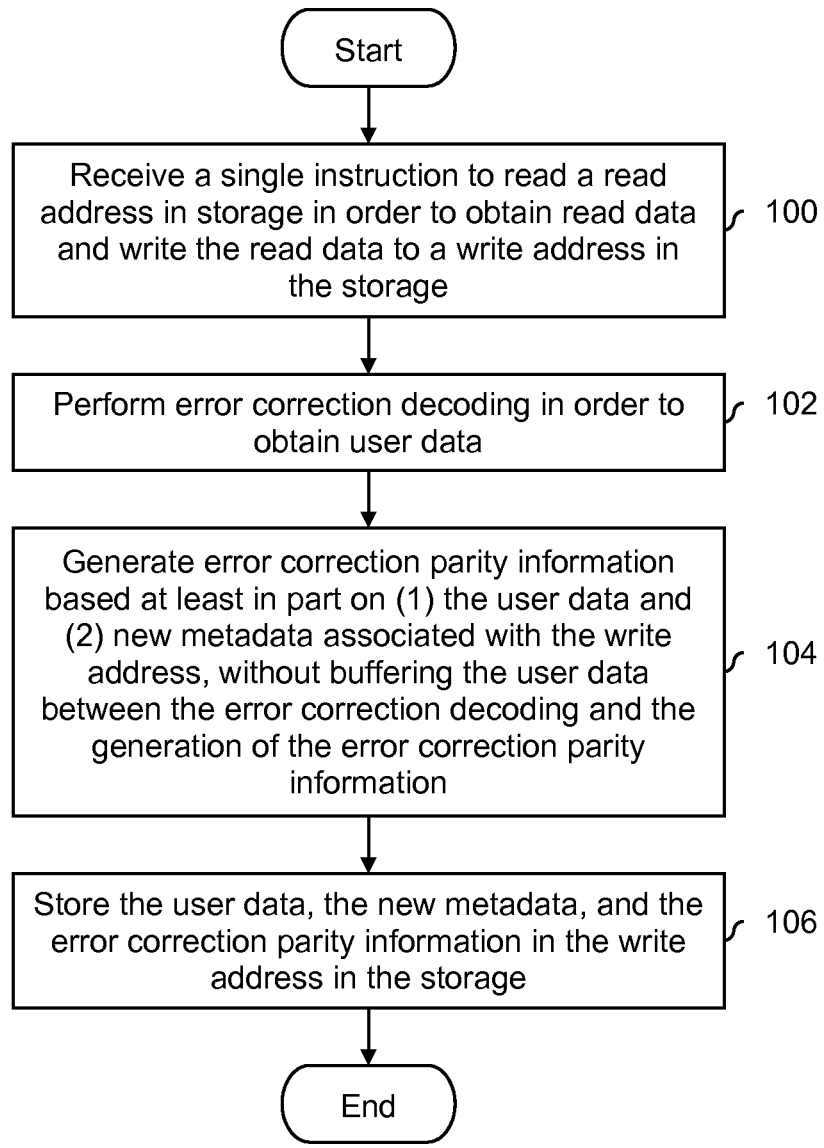
FIG. 1 is a flowchart illustrating an embodiment of an accelerated copyback process.

FIG. 1 is a flowchart illustrating an embodiment of an accelerated copyback process. In some embodiments, the process is performed by a storage controller which is implemented as a semiconductor device, such as a field-programmable gate array (FPGA) or an application-specific integrated circuit (ASIC). In some embodiments, the storage controller controls one or more solid state storage media "chips" and as such is referred to as a solid state storage controller.

At 100, a single instruction to read a read address in storage in order to obtain read data and write the read data to a write address in the storage is received. For example, the instruction may be issued by firmware and received by the storage controller. Such an instruction received at step 100 may be referred to as a copyback instruction and may include the read address and write address as inputs or parameters associated with the copyback instruction, such as:

copyback<read address> <write address>

At 102, error correction decoding is performed in order to obtain user data. In some embodiments, there is some pre-processing that is performed on the read data obtained from the read address before error correction decoding is performed. In various embodiments, various error correction codes may be used at step 102, such as BCH codes or low-density parity-check (LDPC) codes.

At 104, error correction parity information is generated based at least in part on (1) the user data and (2) new metadata associated with the write address, without buffering the user data between the error correction decoding and the generation of the error correction parity information. For example, in some systems, metadata is stored with the user or payload data that includes a logical address that may be used to rebuild a logical-to-physical address mapping table if needed, or a sequence number. In one example, after read-related processing has completed, the results may go directly from the read path to the write path (e.g., without first being buffered in some memory or storage).

In some embodiments, a reduced or stripped-down hardware processor is used at step 106 to generate the error correction parity information. For example, a reduced encoder may be configured to input or otherwise operate on a shorter input, such as just the metadata as opposed to user data, CRC parity, and metadata. This may save power (and time) compared to if a full blown error correction encoder were used.

At 106, the user data, the new metadata, and the error correction parity information are stored in the write address in the storage. As described above, a storage interface may handle communicating with one or more storage chips in order to perform step 106.

In some embodiments, additional processing is performed and/or additional information is stored. For example, as will be described in an example below, data may be scrambled to improve the performance of the system and/or CRC checking may be performed.

One benefit to the process described above is that it speeds up the copyback process. For example, some other storage system may require firmware to issue two commands in order to perform a copyback: a read instruction first (e.g., read <read address>) followed by a write instruction (e.g., write <write address> <write data>). While the (hardware) storage controller waits for the firmware to issue the write instruction, the read data may be stored in some buffer. Using a single command or instruction for a copyback reduces data transfer latency since the data does not need to be temporarily stored in a buffer, it reduces the number of commands issued from two to one (which saves processing time in a command queue), and/or reduces the interrupt processing time since only one command is used.

In one estimate, a copyback of 4 KB of data using the technique described above saves approximately 25 µS of time. Similarly, for dual-plane Flash pages (32 KB), the time saved is approximately 100 µS. This time savings is especially important for solid state storage systems compared to other types of storage systems (e.g., hard disk drive systems) since solid state storage systems have flash translation layer (FTL) related operations to perform, such as sudden power off recovery (SPOR) (i.e., reading the solid state storage in order to rebuild the logical-to-physical address mapping table after an unexpected power off) and garbage collection (e.g., since in-place updates cannot be performed). For example, half of a superblock (512 MB) is copied to a new location after SPOR and using a single copyback command would save approximately (256 MB/32 KB)*100 µS=0.8 seconds of time.

Another benefit to the system described above is that it does not require changes to the interface between the storage media chip(s) (e.g., solid state storage media chip(s)) and the storage controller. That is, current solid state storage chips are capable of supporting the accelerated copyback process since the signaling or handshaking between the storage controller and the storage chip(s) is the same, only faster. This is desirable since accelerated copybacks can be supported without having to manufacture new solid state storage chips, which can be a time-consuming and expensive process.

Figure 2:
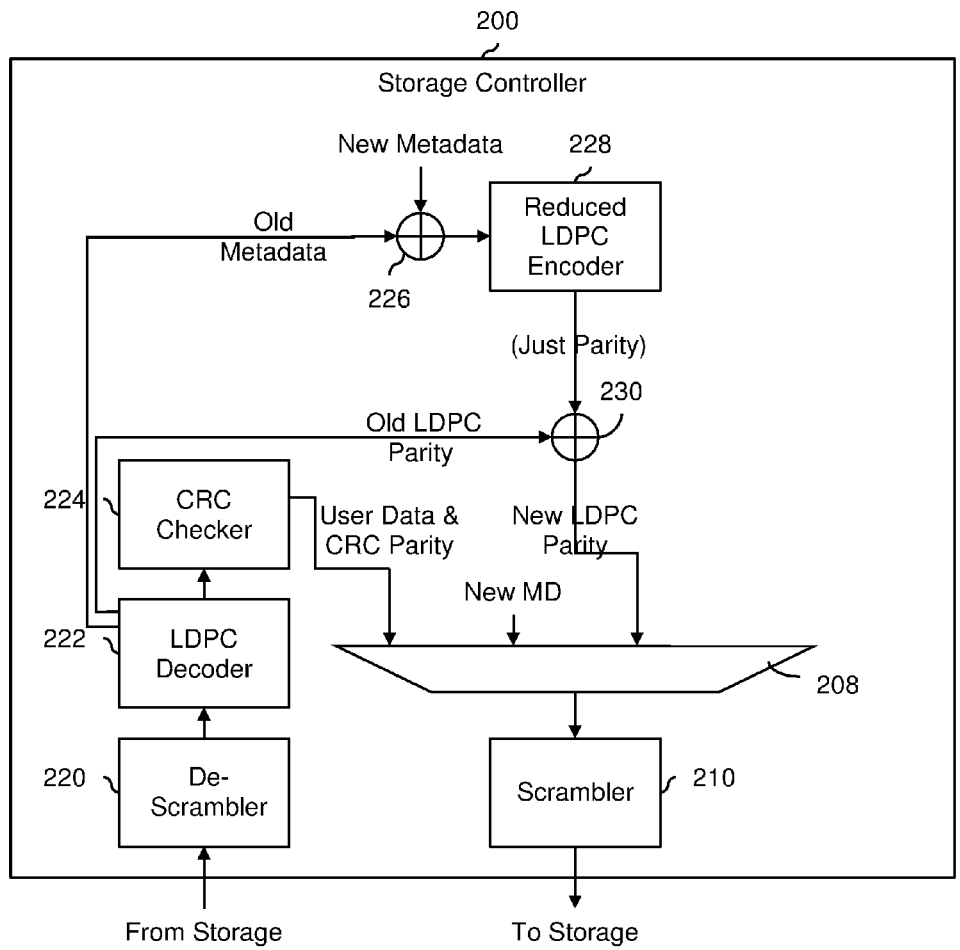
FIG. 2 is a diagram illustrating an embodiment of a storage controller which performs accelerated copyback.
Figure 2:
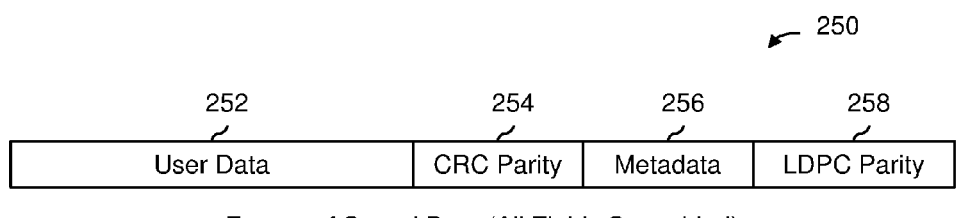

FIG. 2 is a diagram illustrating an embodiment of a storage controller which performs accelerated copyback. For readability, some components which are not directly related to the accelerated copyback feature are not shown. As described above, in some embodiments, storage controller 200 is implemented as a semiconductor device.

In order to clearly describe the components in storage controller 200, components that are associated with a write (e.g., not as part of a copyback) are first described. Then, the components which are involved the copyback are described.

In the event a write instruction is received (e.g., from firmware), the user data that is to be stored (not shown) is input to CRC insertion block 202. To preserve readability, a firmware interface which receives instructions from and returns requested data to firmware is not shown in storage controller 200. CRC insertion block performs CRC encoding and appends CRC parity information to the user data. Diagram 250 shows the format of data stored on storage. In that figure, user data 252 would be input to CRC insertion block 202 and the output of CRC insertion block would be user data 252 and CRC parity 254.

Next, metadata insertion is performed by metadata insertion block 204. The metadata inserted may be system or implementation specific, but in this example includes a logical (block) address. This information may be used to reconstruct a logical-to-physical address mapping table in the even there is a sudden loss of power and the table needs to be rebuilt. In diagram 250, for example, metadata 256 follows CRC parity 254.

After the metadata is inserted, LDPC encoding is performed by LDPC encoder 206. Usage of an LDPC code is merely exemplary and is not intended to be limiting. Any appropriate error correction code (e.g., linear and/or systematic) may be used.

Since the write path that includes CRC insertion block 202, metadata insertion block 204, and LDPC encoder 206 is active, multiplexer 208 is configured to select that input and pass it to scrambler 210. Note that the input to scrambler 210 has all of the fields shown in diagram 250. Scrambler 210 scrambles the user data (252), CRC parity (254), metadata (256), and LDPC parity (258) and the scrambled information is sent to the write address in storage (e.g., solid state storage) that is specified by the write instruction. To preserve readability, a storage interface included in storage controller 200 is not shown herein. Such a storage interface may be responsible for performing the proper handshaking and such between storage controller 200 and one or more storage chips which are connected to storage controller 200 when reading from or writing to the storage chips.

It is noted that the sequence or arrangement of fields in the format shown in diagram 250 may be different compared to some other systems. The reasons and/or benefits to this particular ordering are described in further detail below.

In the event a copyback instruction is received (e.g., from firmware), the copyback instruction, data is read from the read address included in the copyback instruction. The read data (e.g., having the format shown in diagram 250) is passed to descrambler 220 which descrambles the information.

The descrambled information is then passed to LDPC decoder 222 which performs LDPC decoding. Next, CRC checking is performed by CRC checker 224. As can be inferred from the order in which fields appear in diagram 250, the metadata (e.g., field 256) is not protected by the CRC code and as such is not required by CRC checker 224. As such, it may only be necessary to pass the user data (252) and CRC parity information (254) from LDPC decoder 222 to CRC checker 224.

Referring to diagram 250, the user data (252) will remain unchanged before and after the copyback operation is performed. Similarly, since the user data will remain the same, the CRC parity information (254) will also remain the same. Some benefits to the sequence shown in diagram 250 are time savings and power savings. Only the metadata (having, as an example, a length of 4 bytes) needs to be LDPC encoded; the user data (having, as an example, a length of 2 Kbytes) and CRC parity can bypass LDPC encoding. This saves time and power.

Returning to the format shown in diagram 250, since user data 252 and CRC parity 254 are the first and second field, respectively, multiplexer 208 selects those inputs to be output to scrambler 210. To preserve readability in FIG. 2, the blocks from which certain signals are obtained are not shown. In this example, the user data and CRC parity input to multiplexer 208 may be obtained from CRC checker 224 (e.g., that they are corrected by CRC checker 224, if needed).

Next, multiplexer 208 is configured to select the new metadata so that the new metadata is scrambled by scrambler 210. Again, to preserve readability, the source of the new metadata is now shown in FIG. 2, but the new metadata may be obtained from metadata insertion block 204.

Finally, multiplexer 208 is configured to select the new LDPC parity so that the new LDPC parity is scrambled by scrambler 208. To generate the new LDPC parity information, the reduced encoder, such as a reduced LDPC encoder 228, is used. Unlike "full-blown" LDPC encoder 206 which is configured to input and process data having a length the sum of fields 252, 254, and 256, the reduced LDPC encoder 228 is configured to input a much shorter input, specifically the length of the metadata. The new metadata and the old metadata are combined together using adder 226. The sum from adder 226 is passed to the reduced LDPC encoder 228 which generates just a parity in this example. That parity (generated from the sum of the new metadata and the old metadata) is added together with the old LDPC parity using adder 230.

As described above, some sources of some information is not shown in FIG. 2 in order to preserve readability. Although not shown in FIG. 2, the old LDPC parity information (input by adder 230) and the old metadata (input by adder 226) may be obtained from LDPC decoder 222.

Returning to generation of the new LDPC parity, since the LDPC code used by storage controller 200 is linear, the output of adder 230 is the same as if the user data (which does not change as part of the copyback), CRC parity (which does not change as part of the copyback), and new metadata (which has changed as part of the copyback) were processed by the "full-blown" LDPC encoder (206). However, since only adders 226 and 230 and reduced LDPC encoder 228 are used, less power and less time is spent generating the new LDPC parity.

In the copyback path described above, the information is turned around as quickly as possible. For example, as soon as CRC checker 224 completes, the user data and CRC parity (which are corrected, if needed, by CRC checker 224) are passed to scrambler 210 via multiplexer 208. Assuming there are no other delays in the system, this ensures a quick turnaround (e.g., as opposed to storing the user data and/or other information in some buffer and waiting for a second instruction comprising a write instruction, as would be the case in some other systems).

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
a firmware interface configured to receive a single instruction of copyback including a read address to read a read data from a storage, and a write address to write a write data to the storage;
an error correction decoder configured to perform error correction decoding on the read data to generate an old metadata and user data, the user data is forwarded to a scrambler through a CRC checker and a multiplexer without being stored in a buffer, and the old metadata is forwarded to a reduced encoder;
the reduced encoder configured to generate error correction parity information based at least in part on new metadata associated with the write address and the old metadata; and
a storage interface configured to control storing the user data, the new metadata, and the error correction parity information in the write address in the storage.

2. The system recited in claim 1, wherein the system includes a semiconductor device, including one or more of the following: a field-programmable gate array (FPGA) or an application-specific integrated circuit (ASIC).

3. The system recited in claim 1, wherein performing error correction decoding and generating error correction parity information include using a low-density parity-check (LDPC) code.

4. The system recited in claim 1, wherein the reduced encoder is configured to operate on an input having the length of the new metadata.

5. A method, comprising:
receiving a single instruction of copyback including a read address to read a read data from a storage, and a write address to write a write data to the storage;
using an error correction decoder to perform error correction decoding on the read data to generate an old metadata and user data, the user data is forwarded to a scrambler through a CRC checker and a multiplexer without being stored in a buffer, and the old metadata is forwarded to a reduced encoder;
generating error correction parity information based at least in part on new metadata associated with the write address and the old metadata; and
storing the user data, the new metadata, and the error correction parity information in the write address in the storage.

6. The method recited in claim 5, wherein the method is performed by a semiconductor device, including one or more of the following: a field-programmable gate array (FPGA) or an application-specific integrated circuit (ASIC).

7. The method recited in claim 5, wherein performing error correction decoding and generating error correction parity information include using a low-density parity-check (LDPC) code.

8. The method recited in claim 5, wherein generating error correction parity information includes using a reduced encoder that is configured to operate on an input having the length of the new metadata.

9. A computer program product, the computer program product being embodied in a non-transitory computer readable storage medium and comprising computer instructions for:
receiving a single instruction of copyback including a read address to read a read data from a storage, and a write address to write a write data to the storage;
performing error correction decoding on the read data to generate an old metadata and user data, the user data is forwarded to a scrambler through a CRC checker and a multiplexer without being stored in a buffer, and the old metadata is forwarded to a reduced encoder;
generating error correction parity information based at least in part on new metadata associated with the write address and the old metadata; and
storing the user data, the new metadata, and the error correction parity information in the write address in the storage.

10. The computer program product recited in claim 9, wherein the computer instructions for performing error correction decoding and generating error correction parity information include computer instructions for using a low-density parity-check (LDPC) code.

11. The computer program product recited in claim 9, wherein the computer instructions for generating error correction parity information include computer instructions for using a reduced encoder that is configured to operate on an input having the length of the new metadata.

* * * * *